(12) United States Patent
Chowdhury et al.

(10) Patent No.: US 7,433,117 B2
(45) Date of Patent: Oct. 7, 2008

(54) POLARIZATION-DIVERSE OPTICAL AMPLIFICATION

(75) Inventors: Aref Chowdhury, Berkeley Heights, NJ (US); Christopher Richard Doerr, Middletown, NJ (US); Gregory Raybon, Shrewsbury, NJ (US)

(73) Assignee: Lucent Technologies Inc., Murray Hill, NJ (US)

(*) Notice: Subject to any disclaimer, the term of this patent is extended or adjusted under 35 U.S.C. 154(b) by 0 days.

(21) Appl. No.: 11/412,018

(22) Filed: Apr. 26, 2006

(65) Prior Publication Data

US 2007/0253055 A1  Nov. 1, 2007

Related U.S. Application Data

(63) Continuation-in-part of application No. 10/835,753, filed on Apr. 30, 2004.

(51) Int. Cl.
*H01S 3/00* (2006.01)
*G02B 6/00* (2006.01)

(52) U.S. Cl. ............ 359/337; 359/349; 385/11

(58) Field of Classification Search .......... 359/337, 359/349; 385/11, 31
See application file for complete search history.

(56) References Cited

U.S. PATENT DOCUMENTS 4,923,291 A * 5/1990 Edagawa et al. ............ 359/334
4,962,987 A * 10/1990 Doran ........................ 359/108
6,304,380 B1   10/2001 Doerr ......................... 359/484
6,882,764 B1 *  4/2005 Deng et al. ................... 385/14
7,043,099 B1 *  5/2006 Watanabe ..................... 385/11
2005/0244159 A1  11/2005 Chowdhury et al. .......... 398/65

FOREIGN PATENT DOCUMENTS

EP         0 351 133      * 1/1990

OTHER PUBLICATIONS

C. Zu et al., "Polarization Insensitive Wavelength Conversion . . . ," *Optical Review*, vol. 4, No. 5, pp. 546-549 (1997).
M-H. Chou et al., "Optical Signal Processing . . . ," *IEICE Trans. Electron.*, vol. E83-C, No. 6, pp. 869-874 ((Jun. 2000).

* cited by examiner

*Primary Examiner*—Mark Hellner

(57) ABSTRACT

A polarization-diverse optical amplifier includes a polarization-sensitive optically active medium and a polarization splitter. The polarization splitter is configured to receive input light, to direct a first polarization component of the received input light to a first optical path segment, and to direct a second polarization component of the received input light to a separate second optical path segment. The active medium has first and second optical ports. The first optical port is at an end of the first optical path segment. The second port is at an end of the second optical path segment. The active medium outputs amplified light from one of the ports in response to receiving the input light at the other of the ports. In a preferred embodiment, the active medium has an internal optical axis, and the polarizations of the first and second components are oriented relative to that axis so that amplification is enhanced. The two optical path segments may include polarization-maintaining optical waveguides.

15 Claims, 2 Drawing Sheets

POLARIZATION-DIVERSE OPTICAL AMPLIFICATION

CROSS-REFERENCE TO RELATED APPLICATIONS

This application is a continuation-in-part of copending application Ser. No. 10/835,753 filed on Apr. 30, 2004 and entitled "Polarization-Diverse Wavelength Converter (A. Chowdhury 8-84-10).

BACKGROUND

1. Field of the Invention

This invention relates generally to optical amplifiers and more specifically to polarization diversity in optical amplifiers.

2. Discussion of the Related Art

In fiber-optic communication systems, propagating optical signals often arrive at network nodes with unknown polarizations. For example, polarizations of the arriving optical signals may vary unpredictably in time. The absence of a priori knowledge about the polarizations of the arriving optical signals makes it desirable to process such optical signals in a manner that is insensitive to polarization. For that reason, optical devices for processing optical signals are typically constructed to be polarization insensitive or independent; i.e., able to provide comparable performance regardless of the polarization of the input signal to the device.

Examples of devices that should be polarization independent are optical wavelength-converters and optical amplifiers (OAs).

If a component is highly polarization sensitive, then one technique to achieve polarization insensitive operation of the component is to use polarization diversity. To achieve polarization diversity in such devices (e.g., in optical wavelength-converters) it is known to split an arriving optical signal into two orthogonal polarization components and process the two polarization components in separate optical wavelength-conversion media. Ordinary optical wavelength-conversion media are polarization-sensitive. The optical wavelength-converters recombine the light produced in the separate ordinary optical wavelength-conversion media to produce an output optical signal. By splitting, separately wavelength-converting, and then recombining, such optical wavelength-converters can produce optical signals whose power at a converted-wavelength is independent of the polarization of the original arriving optical signal.

Using separate ordinary optical media to wavelength-convert the orthogonal polarization components of an arriving optical signal requires controls. In particular, environmental conditions such as temperature may affect wavelength-conversion in the ordinary optical media. Temporal variations in conditions of the separate optical wavelength-conversion media could destroy the polarization-diversity of the overall optical wavelength-conversion process. To avoid losing polarization-diversity, some optical wavelength-converters include devices that maintain their environmental conditions at constant levels. These environmental control devices are often costly and complex to operate.

Similar limitations would apply to an OA if the amplifying medium is polarization sensitive, such as with many semiconductor OAs.

SUMMARY

Various embodiments provide polarization-diverse (PD) OAs that cause both polarization components of an original optical signal to propagate over the same optical path. The PD-OAs use an optically active medium (AM) to amplify light from both polarization components under substantially the same conditions. Since both polarization components propagate over the same optical path and undergo amplification under substantially the same conditions, these amplifiers have higher stability against changes to environmental conditions.

In accordance with one aspect of our invention, an apparatus includes a polarization-sensitive (PS) optically AM and a polarization splitter. The polarization splitter is configured to receive input light, to direct a first polarization component of the received input light to a first optical path segment, and to direct a second polarization component of the received light to a separate second optical path segment. The PS-AM has first and second optical ports. The first optical port is at an end of the first optical path segment. The second port is at an end of the second optical path segment. The PS-AM outputs amplified light from one of the ports in response to receiving part of the input light at the other of the ports, and conversely.

In a preferred embodiment, the first and second optical path segments include polarization-maintaining optical waveguides. In a further preferred embodiment, the PS-AM has an internal optical axis (IOA), and the polarizations of the first and second components are oriented relative to the IOA so that they enhance amplification of the components.

In accordance with another aspect of our invention, a method provides steps for PD optical amplification of light propagating in an optical path. The steps include splitting input light into orthogonal first and second polarization components, transmitting the first polarization component of the input light to a first end of the optical path, and transmitting the second polarization component of the input light to the second end of the optical path. The optical path comprises an amplifying path segment; that is, it includes a PS-AM having an IOA that is a preferred for optical amplification. Preferably, the polarizations of the two components are oriented relative to the IOA so as to enhance amplification of the components. The steps also include recombining the light output at the two ends of the optical path in response to the acts of transmitting. In one embodiment, the optical path may be viewed as a tandem arrangement of the first path segment, the amplifying path segment and the second path segment.

BRIEF DESCRIPTION OF THE DRAWINGS

In the figures and text, like reference numbers refer to functionally similar features.

Herein, various embodiments are described more fully with reference to accompanying figures and description. The invention may, however, be embodied in various forms and is not limited to the embodiments described herein.

DETAILED DESCRIPTION OF ILLUSTRATIVE EMBODIMENTS

Figure 1:
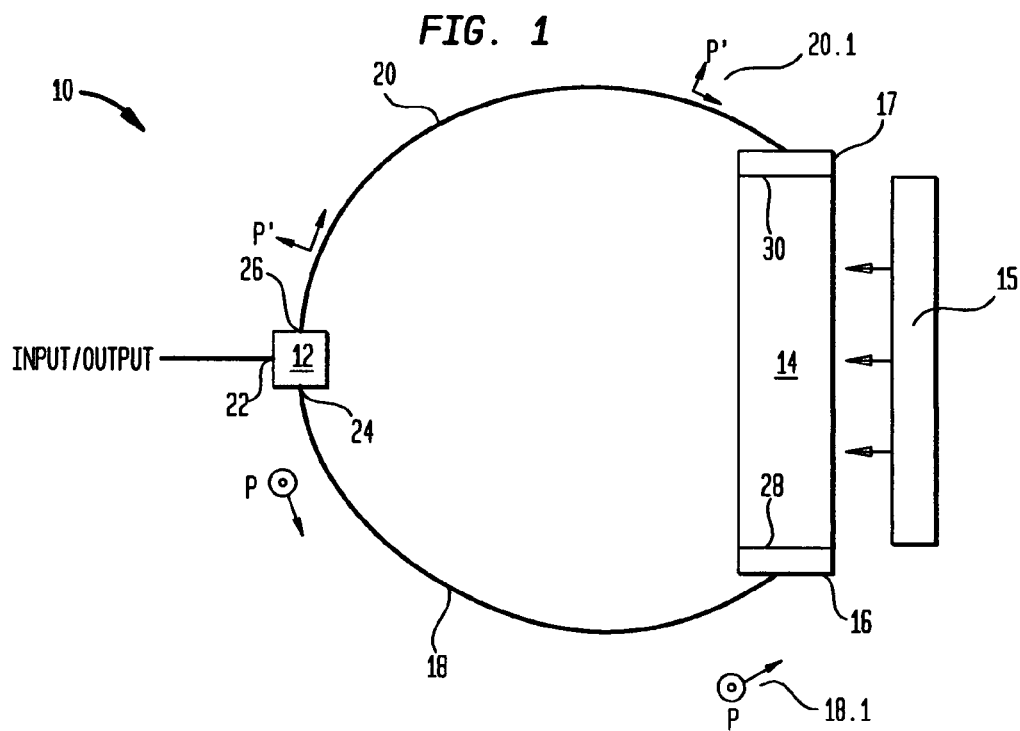
FIG. 1 is a schematic block diagram of an OA that is polarization diverse (PD)

FIG. 1 shows an OA 10 that is configured to produce polarization-diverse (PD) amplification of light propagating in an optical path formed by first and second path segments (e.g., waveguides 18, 20) optically coupled to one another by a third segment that includes an amplifying medium. More specifically, the PD-OA 10 includes a polarization splitter 12; a polarization-sensitive (PS) optically active medium (AM) 14 (either linear or nonlinear); polarization rotators 16, 17; and first and second optical waveguides 18, 20 optically coupled to a source of an input signal to be amplified. When suitable pumping energy is applied to PS-AM 14, it undergoes a population inversion that amplifies input signal light propagating through it. However, the polarization sensitivity of AM 14 implies that a particular polarization preferentially experiences more gain than other polarizations, as discussed more fully hereinafter.

Illustratively, the PS-AM 14 may be the narrow bandgap active region of a heterostructure semiconductor amplifier, the photonic crystal (PC) optical fiber active region of a PC amplifier, or the rare-earth doped active region of either a high power fiber amplifier (REDFA) or of a planar waveguide (PWG) amplifier.

Typically the pumping energy is either optical or electrical, depending on the particular type of OA. For example, in the case of a semiconductor OA, electrical pump energy typically takes the form of suitable voltage and current applied to the device to cause carriers to be injected into the active region. In a bipolar device, the carriers (i.e., holes and electrons) undergo the population inversion requisite for amplification of signal light propagating through PS-AM 14. In this case, therefore, the pump source 15 comprises a voltage source that forward biases the active region and provides the requisite carrier injection. On the other hand, in the case of a REDFA, a PC OA or a PWG OA optical pump energy typically takes the form of pump light that is absorbed by PS-AM 14 to generate the requisite population inversion. In the latter cases, pump source 15 illustratively comprises an array of laser diodes that longitudinally illuminates PS-AM 14. By longitudinal illumination or pumping we mean that pump light is coupled into an end face of an elongated active medium so that it propagates along the medium in the same direction as the signal to be amplified (referred to as a co-propagating pump) or in the opposite direction (referred to as a counter-propagating pump), or both. Either type of longitudinal pump scheme may also be referred to as end-pumping. (See, the embodiments of FIGS. 3 & 4 discussed, infra.). Finally, we note that a semiconductor OA could also be longitudinally pumped, as above, or it may be transversely pumped; that is, the device can be provided with a suitable window to allow pump light to enter the active region via the window in a direction essentially perpendicular (i.e., transverse) to the layers of the device. In a similar fashion, a REDFA or a PWG OA could also be transversely pumped. However transverse optical pumping may not be preferred due to a limited interaction length between the signal to be amplified and the pump light.

Returning now to FIG. 1, note that polarization splitter 12 receives input signal light of arbitrary polarization at optical port 22 and splits the received signal light into orthogonal plane-polarization components 18.1, 20.1. The polarization splitter 12 outputs one plane-polarization component 18.1 of the received light to optical waveguide 18 via optical port 24 and outputs the other plane-polarization component 20.1 of the received light to optical waveguide 20 via optical port 26.

Exemplary polarization splitters 12 include Nicol, Rochon, Glan-Thompson, and Wollastan prisms, planar waveguide polarization splitters, and other optical polarization splitters known to those of ordinary skill in the art.

PS-AM 14 is typically incorporated in an optical waveguide that connects optical port 28 to optical port 30. Consistent with the types of AMs identified above, exemplary optical waveguides include a rare-earth-doped fiber, or a relatively high refractive index region, which is located in a bulk, planar, or buried structure of an optical medium (e.g., a semiconductor or silica). The PS-AM 14 has an optical port 28, 30 at each end of the internal optical waveguide, which is adapted for providing optical gain (i.e., amplification). For that reason, the PS-AM 14 will output amplified signal light from either optical port 28, 30 in response to the other optical port 30, 28 receiving input light and PS-AM 14 being suitably pumped by energy from pump source 15.

The PS-AM 14 has an internal optical axis (IOA). If the (linear) polarization of the input signal light is oriented at a preferred angle $\alpha$ relative to the IOA, amplification is most efficient. Depending on the design of the PS-AM 14, $\alpha$ might be zero, in which case polarization of the input light is preferably substantially parallel to the IOA; or $\alpha$ might be 90°; in which case the polarization of the input light is preferably substantially perpendicular to the IOA; or $\alpha$ might have a value $\alpha_0$ between these two extremes, in which case the polarization of the input light is preferably oriented at the angle $\alpha_0$ relative to the IOA. Hence, we refer to any linear polarization oriented at an angle $\alpha$ to the IOA as being preferred. For that reason, the PS-AM 14 is not a polarization-independent optical device; rather, it is polarization sensitive or dependent. Illustrations of the IOA include the direction substantially perpendicular or parallel to the layers of a heterostructure semiconductor OA, the direction substantially perpendicular to the plane of a PWG OA, and the direction substantially parallel to the axis of symmetry (or birefringence axis) of a PC fiber OA. However, depending on the details of their designs, these devices may alternatively have IOAs that are oriented neither parallel nor perpendicular to the particular layers or planes discussed above.

Figure 3:
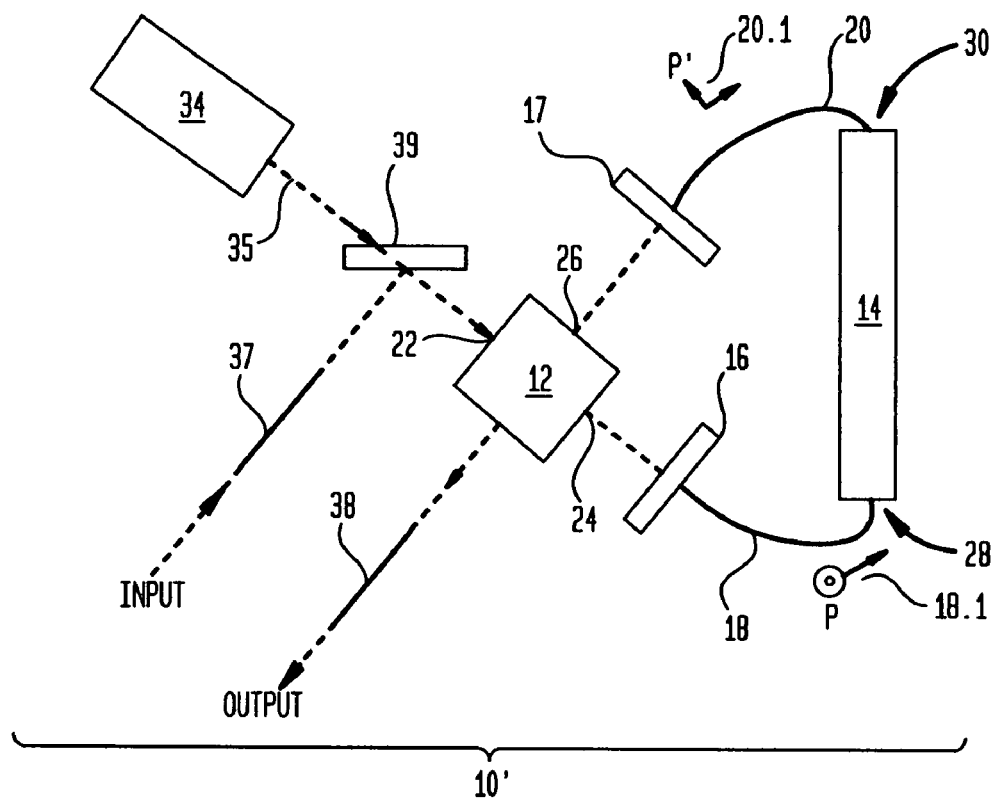
FIG. 3 is a schematic block diagram of another embodiment of the PD-OA of FIG. 1.
Figure 4:
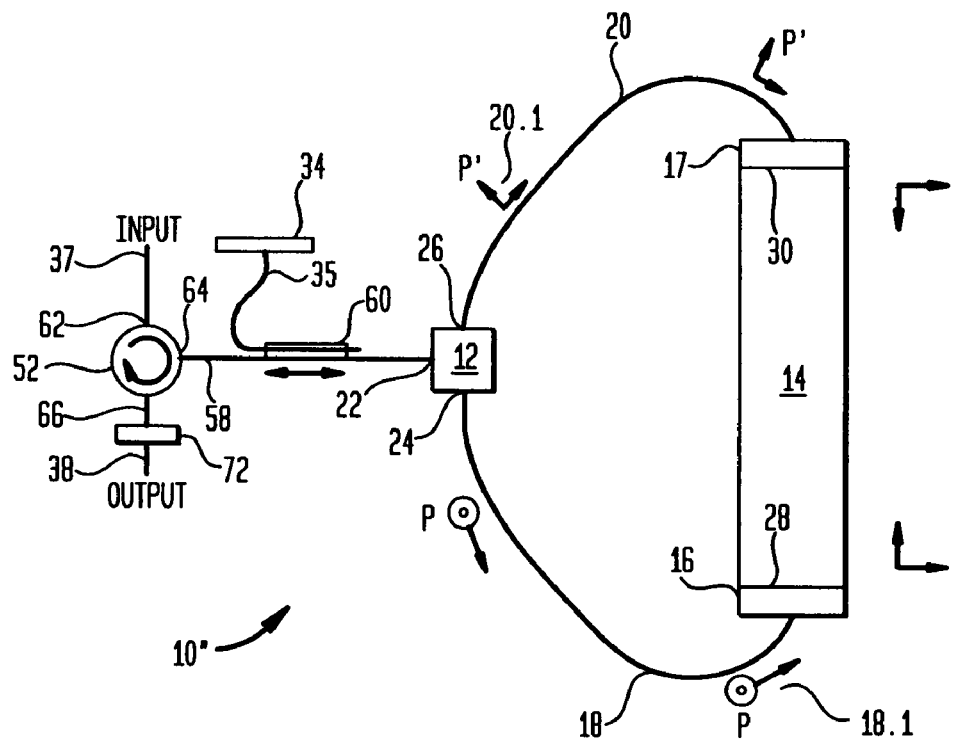
FIG. 4 is a schematic block diagram of yet another embodiment of the PD-OA of FIG. 1.

For simplicity in the description of FIGS. 1, 3 and 4 that follows, we will assume that $\alpha=0$ and that the polarizations of the input signal light components are oriented substantially parallel to the IOA of PS-AM 14 as they enter PS-AM 14.

PD-OA 10 includes features that compensate for the polarization-dependent character of PS-AM 14.

First, optical waveguides 18, 20 and polarization rotators 16, 17 are configured to deliver light to both optical ports 28, 30 so that the polarizations of the input light components 18.1, 20.1 are preferably substantially parallel to the IOA of PS-AM 14 upon entering PS-AM 14. The optical waveguides 18, 20 may be specifically configured to maintain the plane polarizations P, P' received via optical ports 24, 26 of the polarization splitter 12. For example, the optical waveguides 18, 20 may be polarization-maintaining optical fibers (PMFs). In preferred embodiments, the PMFs are also oriented to deliver light to optical ports 28, 30 such that the light components are polarized substantially along the IOA of the PS-AM 14. In such embodiments, the polarization rotators 16, 17 are absent. In other such embodiments, the PMFs have transverse optical axes that are oriented to launch non-optimally polarized light components toward the ends of PS-AM 14. In such embodiments, the polarization rotators 16, 17 rotate plane polarizations P, P' of the launched light so that the polarizations are substantially parallel to the IOA of the PS-AM 14 at the optical ports 28, 30.

Exemplary polarization rotators 16, 17 are suitably oriented half-wave plates, optically active media, obliquely oriented mirror pairs, or other well-known polarization rotators.

Typically, the first and second polarization rotators 16, 17 produce relative rotations of approximately 90° so that light is delivered to both ends of the PS-AM 14 with substantially the same polarization, e.g., the optimal, preferred polarization for optical amplification therein. (In fiber optic applications, in lieu of rotators 16, 17 polarization rotation may also be effected by simply axially twisting at least one of the fibers so that there is a 90° difference in polarizations between the two fibers, and so that the polarizations entering ports 28, 30 of PS-AM 14 are substantially parallel to its IOA.) It is clear, therefore, that polarization rotators may be used in pairs, as shown in FIG. 1, may be used singly in only one of path segments, or may be omitted altogether, depending on the particular design of the PD-OA.

Alignment errors between the polarizations of the input light and the IOA of the PS-AM 14 are 10° or less, preferably are 5° or less, and more preferably are 1° or less.

In PD-OA 10, optical port 22 receives input light and transmits output light. Both polarization components travel the same optical paths, albeit in opposite directions. Both polarization components undergo optical amplification under substantially the same conditions; i.e., experiencing substantially the same pump energy and preferably having substantially the same polarization orientations in PS-AM 14. For these reasons, PD-OA 10 has a relatively low sensitivity to changes in environmental conditions.

Figure 2:
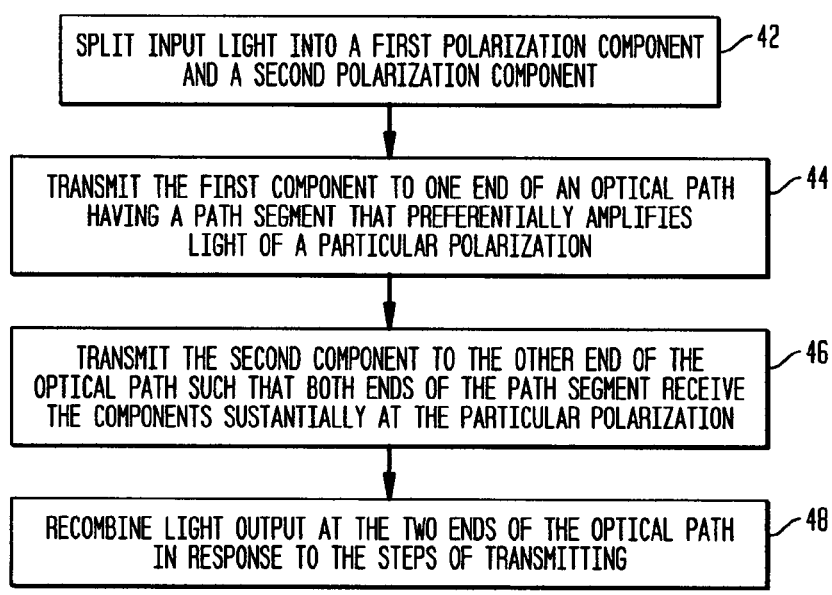
FIG. 2 is a flow chart for a method of operating a PD-OA, e.g., the PD-OA of FIG. 1, 3 or 4.

FIG. 2 illustrates a method 40 for performing optical amplification of light propagating in an optical path in a polarization-diverse manner, e.g., in a PD-OA 10, 10', 10" of FIG. 1, 3, or 4, respectively. As discussed previously, the optical path illustratively includes a tandem arrangement of path segments; i.e., first and second path segments (e.g., waveguides 18, 20) optically coupled to one another by a third segment that includes an amplifying medium (e.g., PS-AM 14). In general, Step 42 of method 40 includes splitting received input signal light into a first plane-polarization component and an orthogonal second plane-polarization component. The first component has a linear polarization that is orthogonal to a linear polarization of the second component. Step 44 of the method 40 includes transmitting the first polarization component of the received light to a first end of the optical path. The optical path includes a polarization-sensitive path segment for amplifying optical radiation (or light). The light amplifying path segment includes a PS-AM that is adapted to amplify light having the wavelength of the input signal light, e.g., as in PS-AM 14 of FIGS. 1, 3, and 4. Step 46 of method 40 includes transmitting the second polarization component of the received input signal light to the second end of the same optical path and simultaneously transmitting the first polarization component to the first end. Furthermore, the transmitting steps preferably cause the two polarization components of the input light to have substantially parallel polarization states in the amplifying path segment.

In some embodiments, polarizations of one or both components are rotated prior to insertion into the amplifying path segment to align their polarizations in the amplifying path segment (e.g., within the PS-AM 14). In some embodiments, one or both components are sent through suitably aligned polarization-maintaining optical waveguides to cause the polarizations of the two components to be substantially parallel to one another in the amplifying path segment and substantially parallel to a particular, preferred orientation for optimum amplification (e.g., preferably substantially parallel to the IOA of PS-AM 14).

Step 48 of method 40 includes recombining light that is outputted (i.e., egresses) from the two ends of the optical path in response to the steps of transmitting. The recombined light constitutes amplified signal light. In the recombined light, the intensity and quality of the amplified light are substantially independent of the polarization of the original input signal light so that the method 40 is polarization-diverse. Method 40 remains polarization-insensitive as environmental conditions change due to two features. First, both polarization components traverse substantially the same optical path between the steps of splitting and recombining. Second, both polarization components undergo amplification under substantially the same conditions.

Note, when method 40 is applied to embodiments of our invention that employ longitudinal pumping of PS-AM 14, such as those shown in FIGS. 3-4 and described below, then step 42 involves splitting both the input light and the pump light into first and second polarization components and step 48 involves recombining both the amplified light and the pump light.

FIGS. 3 and 4 show longitudinally pumped embodiments of PD-OAs 10', 10" for WDM optical communication networks. Thus, in these embodiments the pump source 15 of FIG. 1 takes the form of a pump laser source 34 whose output is longitudinally coupled into PS-AM 14 via an arrangement of suitable optical components described below.

FIG. 3 shows a PD-OA 10' that is polarization-diverse. The PD-OA 10' includes polarization splitter 12; PS-AM 14; pump laser source 34 optically coupled to PS-AM 14; Faraday optical rotators 16, 17; and preferably polarization-maintaining optical fibers (PMFs) 18, 20 as already described with respect to PD-OA 10 of FIG. 1. Here, the optical rotators 16, 17 rotate polarizations of light received from the polarization splitter 12 by 45° up to rotation errors of 5° or less and preferably of 1° or less. The optical rotators 16, 17 transmit the polarization-rotated light to PMFs 18, 20. The PMFs are oriented to maintain the polarizations of the light incident thereon. The PMFs 18, 20 are also oriented to deliver the light to optical ports 28, 30 of PS-AM 14 so that the polarizations of the delivered light are oriented substantially along the IOA of the PS-AM 14.

PD-OA 10' also includes pump laser source 34, pump optical fiber 35, input optical fiber 37, output optical fiber 38, and dichroic slab 39. The pump laser source 34 produces pump light for use in optical amplification. The pump optical fiber 35 is a PMF that delivers pump light to the dichroic slab 39 with a selected polarization. The input optical fiber 37 delivers input light to the dichroic slab 39. The dichroic slab 39, which may, for example, be a thin film device, selectively transmits light at the wavelength of the pump laser source 34 and selectively reflects light at the wavelength of the input light. That is, the dichroic slab 39 is configured to direct both the pump light and the input light toward optical port 22 of polarization splitter 12.

In one embodiment, the pump optical fiber 35 is oriented to emit pump light whose polarization makes an angle of 45°±5° or 45°±1° with respect to the internal optical axis of the polarization splitter 12 at optical port 22. For that reason, the polarization splitter 12 transmits substantially the same intensity of pump light to each optical port 24, 26. Since the optical fibers 18, 20 are oriented to maintain polarizations of light received from the optical rotators 16, 17, these optical fibers 18, 20 deliver received pump light intensities to optical ports 28, 30 without substantial attenuation. Since each optical fiber 18, 20 receives substantially the same intensity of pump light, the optical fibers 18, 20 deliver substantially the same pump light intensity to each optical port 28, 30 of PS-AM 14.

The optical fibers 18, 20 close an optical loop between optical ports 24, 26. In the optical loop, the optical fibers 18, 20 deliver light received from the PS-AM 14 to the optical rotators 16, 17 and thus to polarization splitter 12. Around the optical loop, an overall polarization rotation of about 90° occurs; i.e., due to the non-reciprocity of the Faraday effect in the optical rotators 16, 17. This polarization rotation causes the polarization splitter 12 to redirect light, which is received from the loop, to output optical fiber 38 rather than back to optical port 22.

In PD-OA 10' different polarization components of input light do not co-propagate in PMF. In particular, pump optical fiber 35, which is a PMF, carries only pump light, and optical fibers 18, 20, which are also PMFs, carry only a single polarization component of the input light. In addition, because the light components travel essentially identical optical path lengths, the input light does not undergo significant polarization-mode dispersion (PMD) in the PD-OA 10'. (Low PMD is also a characteristic of PD-OAs 10 and 10".) Low or zero PMD is desirable in WDM optical communication networks operating at high data rates, because PMD can be a significant limitation on optical data transmission rates.

However, our PD-OAs 10, 10', 10" are not limited to use in WDM communication systems. For example, they may find application as high power OAs in free-space communications (e.g., between satellites).

Some embodiments of PD-OA 10' of FIG. 3 have additional improvements. For example, a dichroic slab may be inserted between the optical output of polarization splitter 12 and output optical fiber 38 in order to reject left over pump light. Also, the two optical Faraday rotators 16, 17 may be replaced by a single optical device that produces a rotation of about 90°. (The single 90° rotation device may be located anywhere between ports 26 and 30 or between ports 24 and 28.) Also, the polarization splitter 12 may be a walk-off crystal rather than the polarization splitter cube shown in FIG. 3. For such a polarization splitter 12, the Faraday optical rotators 16 and 17 may be replaced by a single Faraday optical rotator, because optical outputs 24, 26 can transmit light to different locations on the single Faraday optical rotator.

FIG. 4 shows a second OA 10" that is polarization-diverse. The PD-OA 10" includes a polarization splitter 12; a PS-AM 14; optical rotators 16, 17; and PMFs 18, 20, as already described with respect to PD-OAs 10, 10' of FIGS. 1 and 3. The PD-OA 10" also includes optical circulator 52, pump laser source 34, pump fiber 35 coupled to optical waveguide 58 via an optical fiber coupler 60.

Optical circulator 52 has three, ordered, optical ports 62, 64, 66. The first optical port 62 receives input signal light from input optical fiber 37 of, for example, a WDM optical communication network. The second optical port 64 transmits the input signal light to a first end of optical waveguide 58. The third optical port 66 transmits light received at the second optical port 64 to output optical fiber 38 of the WDM optical communication network.

Pump laser source 34 transmits linearly polarized pump light to optical pump fiber 35, which in turn transmits the pump light to optical fiber coupler 60. The pump fiber 35 and the optical fiber coupler 60 are polarization-maintaining waveguides whose transverse optical axes are aligned to efficiently deliver linearly polarized pump light to optical waveguide 58.

Optical waveguide 58 is a polarization-maintaining optical waveguide, which connects the second optical port 64 of optical circulator 52 and optical fiber coupler 60 to optical port 22 of polarization splitter 12. The optical port 22 functions as both an optical input, which transmits input and pump light to the polarization splitter 12, and as an optical output, which receives a mixture of pump and amplified light from the polarization splitter 12. The polarization-maintaining optical waveguide 58 has its transverse optical axis aligned to deliver pump light to optical port 22 so that the polarization splitter 12 splits the delivered pump light intensity substantially equally between optical waveguide 18 and optical waveguide 20.

Preferably the optical waveguides 18, 20 are also PMFs whose transverse optical axes are aligned to deliver substantially equal pump light intensities to each side of PS-AM 14. One or two optical rotators 16, 17 may produce polarization rotations so that polarizations of light emitted from the optical waveguides 18, 20 are preferably substantially aligned with the IOA of PS-AM 14 at optical ports 28, 30. The IOA of PS-AM 14 may also be oriented so that both PMFs 18, 20 deliver light polarized substantially along that optical axis.

The optical waveguides 18, 20 also deliver light from the PS-AM 14 to polarization splitter 12. Optical splitter 12 transmits the light, which is delivered to optical ports 24, 26, to optical port 22. From optical port 22, optical waveguide 58 transports light to second optical port 64 of optical circulator 52. From the second optical port 64, the optical circulator 52 transmits light to optical port 66, which connects to output optical fiber 38.

Some embodiments of PD-OA 10" also include one or more band pass optical filters 72 inserted between the third optical port 66 of optical circulator 52 and output optical fiber 38 of the WDM optical communication network. The band pass optical filter 72 removes light having a wavelength of the pump light. Then, the output optical fiber 38 of the WDM optical communication network receives substantially only light at the amplified wavelength, which is produced in PS-AM 14.

Referring to FIGS. 3 and 4, PD-OAs 10', 10" are substantially insensitive to environmental conditions and are polarization diverse for two reasons. First, both polarization components circulate along the same optical path in the optical PD-OAs 10', 10". Second, input light is subject to substantially the same amplifying conditions in the optical PS-AMs 14. In particular, pump light of substantially the same polarization and intensity is launched longitudinally into each end of PS-AM 14. Furthermore, input light is launched into each end of the PS-AM 14 with substantially the same polarization.

Other embodiments of the invention will be apparent to those skilled in the art in light of the specification, drawings, and claims of this application.

What is claimed is:

1. An apparatus comprising:
   a polarization splitter configured to receive input light, to direct a first polarization component of the received input light to a first optical path segment, and to direct a second polarization component of the received input light to a separate second optical path segment;
   a polarization-sensitive optically active medium having an internal optical axis, said active medium being configured to amplify said input light when suitable pumping energy is applied to thereto, said active medium having first and second optical ports, the first port being at an end of the first optical path segment, the second port being at an end of the second optical path segment, said active medium being configured to output amplified light from one of the ports in response to receiving the input at the other of the ports; and an optical source of said pump energy, said source comprising at least one laser longitudinally coupled to said active medium, wherein said polarization splitter is configured to receive pump light from said laser to direct a first polarization component of the received pump light to said first optical path segment, and to direct a second polarization component of the received pump light to said second optical path segment, said first and second optical path segments being configured so that the intensities of said first and second pump light components are substantially equal upon entering said active medium, and wherein said first and second optical paths are configured so that the polarizations of said first and second input light components are substantially parallel to one another upon entering said ports.

2. The apparatus of claim 1, wherein each of said first and second optical path segments comprises a polarization-maintaining optical waveguide.

3. The apparatus of claim 1, wherein said first and second optical path segments are configured so that the polarizations of said first and second components are oriented relative to said internal axis so as to enhance amplification of said components.

4. The apparatus of claim 3, wherein said first and second optical path segments are configured so that the polarizations of said first and second components are oriented substantially parallel to said internal axis.

5. The apparatus of claim 1, further including a polarization-maintaining waveguide coupling said optical source of said pump energy to said active medium.

6. The apparatus of claim 1, wherein at least one of said optical path segments includes a Faraday rotator.

7. The apparatus of claim 6, wherein said optical path segments are configured to deliver polarized light to said splitter such that the delivered polarized light exits said splitter from a different optical port than an optical port of the polarization splitter that received the input light.

8. An apparatus comprising:
a polarization splitter configured to receive input light, to direct a first polarization component of the received input light to a first optical path segment, and to direct a second polarization component of the received input light to a separate second optical path segment;
a polarization-sensitive optically active medium having an internal optical axis, said active medium being configured to amplify said input light when suitable pumping energy is applied to thereto, said active medium having first and second optical ports, the first port being at an end of the first optical path segment, the second port being at an end of the second optical path segment, said active medium being configured to output amplified light from one of the ports in response to receiving the input at the other of the ports; and
an optical source of said pump energy, said source comprising at least one laser longitudinally coupled to said active medium,
wherein said polarization splitter is configured to receive pump light from said laser, to direct a first polarization component of the received pump light to said first optical path segment, and to direct a second polarization component of the received pump light to said second optical path segment, said first and second optical path segments being configured so that the intensities of said first and second pump light components are substantially equal upon entering said active medium, and
wherein each of said first and second optical path segments comprises a polarization-maintaining optical waveguide; and
wherein said first and second optical path segments are configured so that the polarizations of said first and second input light components are oriented relative to said internal axis so as to enhance amplification of said components.

9. The apparatus of claim 8, wherein said first and second optical path segments are configured so that the polarizations of said first and second components are substantially parallel to said internal axis.

10. The apparatus of claim 8, further including a polarization-maintaining waveguide coupling said optical source of pump energy to said active medium.

11. A method for optical amplification comprising the steps of:
splitting received input light into a first polarization component and a second polarization component;
transmitting the first polarization component to a first end of an optical path having an amplifying path segment, the path segment including a polarization-sensitive optically active medium configured to preferentially amplify light of a particular polarization;
transmitting the second polarization component to the second end of the optical path;
said transmitting steps configured to orient the polarizations of the first and second components substantially parallel to the particular polarization;
coupling optical pump light into the active medium by directing a first polarization component of the pump light to the first optical path segment and directing a second polarization component of the pump light to the second optical path segment, the the first and second optical path segments being configured so that the intensities of the first and second pump light components are substantially equal upon entering the active medium, and
recombining input light outputted at the two ends of the optical path in response to the acts of transmitting.

12. The method of claim 11, wherein the particular polarization is oriented at an angle $\alpha$ to an internal optical axis of the active medium, and said transmitting steps are configured to Orient the polarizations of the first and second components substantially at the angle $\alpha$ to said internal axis.

13. The method of claim 11, wherein the splitting step also splits received pump light into first and second polarization components and the transmitting steps transmit the first and second pump components to opposite ends of the amplifying path segment, so that the intensities of the pump components are substantially equal upon entering the amplifying path segment.

14. The method of claim 11, wherein the optical path includes a polarization-maintaining optical waveguide between its first end and the amplifying path segment and the optical path includes a polarization-maintaining optical waveguide between its second end and the amplifying path segment.

15. The method of claim 11, wherein the coupling step includes transmitting the pump light to the active medium through a polarization-maintaining waveguide.

* * * * *